United States Patent [19]

Schauer

[11] Patent Number: 4,494,308
[45] Date of Patent: Jan. 22, 1985

[54] CONNECTING A CABLE TO A P.C. BOARD

[75] Inventor: Friedrich Schauer, Heroldsberg, Fed. Rep. of Germany

[73] Assignee: Kabelmetal Electro GmbH, Hanover, Fed. Rep. of Germany

[21] Appl. No.: 386,698

[22] Filed: Jun. 9, 1982

[30] Foreign Application Priority Data

Jul. 25, 1981 [DE] Fed. Rep. of Germany ....... 3129417

[51] Int. Cl.³ .............................................. H05K 3/34
[52] U.S. Cl. ........................................ 29/858; 29/860;
339/17 R; 339/17 E; 339/176 MP; 361/400
[58] Field of Search ...................... 361/400, 408, 413;
174/68.5; 339/17 R, 176 MP, 18 P, 18 R, 17 E;
29/839, 840, 841, 843, 845, 858, 860

[56] References Cited

U.S. PATENT DOCUMENTS

| 3,143,787 | 8/1964 | Babbe | 339/17 E X |
|---|---|---|---|
| 3,340,439 | 9/1967 | Henschen et al. | 361/413 |
| 3,551,874 | 12/1970 | Volinskie | 339/17 R |
| 3,581,268 | 5/1971 | Akst | 339/18 R |
| 3,643,201 | 2/1972 | Harwood | 361/413 X |
| 3,727,168 | 4/1973 | Henschen et al. | 361/408 X |
| 3,744,128 | 7/1973 | Fisher et al. | 29/858 |
| 4,249,229 | 2/1981 | Hester | 361/400 X |
| 4,410,928 | 10/1983 | Aramaki | 361/400 |

OTHER PUBLICATIONS

Augat Inc., Short Form Catalog, Nov. 1972.

Primary Examiner—R. R. Kucia
Attorney, Agent, or Firm—Ralf H. Siegemund

[57] ABSTRACT

The individual conductors of a cable are connected to a P.C. board under utilization of an auxiliary member having a plate in which are inserted solder pins. The conductors of the cable are connected to one side of the pins, an insulated body is molded around that connection including the conductor ends and the end of the cable; the pins project in a particular pattern from the auxiliary member and are inserted in a matching pattern of solder sleeves in the P.C. board and the pins are soldered to the sleeves. The auxiliary member is separately bolted to the P.C. board.

3 Claims, 2 Drawing Figures

CONNECTING A CABLE TO A P.C. BOARD

BACKGROUND OF THE INVENTION

The present invention relates to connecting a multi-conductor cable to electric circuit elements which are mounted on suitable carriers, and more particularly, the invention relates to solder connection between such a cable and prefabricated circuitry.

In the art of the printed circuitry a carrier element, such as a printed circuit board, provides a mounting structure for circuit modules or individual circuit elements. The need arises to provide external connection between the conducting lines on the board and other components outside of the printed circuit board. For this, it has been suggested to construct the art work of the printed circuit lines on such a carrier in such a manner that many or all such lines which require external connection end along one edge, and plug elements are clamped to that edge to make contact, on one hand, with these circuit lines, preferably in a releasable manner while permitting, on the other hand, engagement with counter plug elements from which a suitable cable connections or other connecting devices extend.

This particular mode of connection is disadvantaged by the fact that basically the resistance provided and established by the interface between the printed circuit lines on one hand and the contacting connector element, on the other hand, is not or at least insufficiently constant. Moreover, that particular resistance is predeterminable to a limited extent only and may vary as time progresses. This is particularly the case if the connecting network as a whole and cables involved in the overall connection, as well as the board, experience to some extent mechanical loads.

Alternatively, it has been suggested that the connecting circuit lines on such a board or other carrier, are provided with soldering vanes or soldering ears, permitting soldering of the individual conductors in the connecting circuit to the cable. Undoubtedly, this kind of arrangement results in well defined electrical resistances in the connection between the elements, and the portions of the resistances that include the solder points will not necessarily experience any load of, if it experiences mechanical loads, the electrical resistance will not change.

However, this arrangement is disadvantaged by the fact that, as experience has shown, the wires are soldered occasionally to the wrong vanes. In view of the large multitude of connections involved, it is most likely and has in fact been so observed that these incorrect connections are discovered only afterwards when the particular device is tested. Moreover, it was found that in the case of such an error it is not necessarily economical to make the requisite correction; rather it may be more advantageous to discard the faulty assembly. This, of course, is a relative aspect, and needless to say, these erroneous connections should be avoided, because they constitute a definite loss.

DESCRIPTION OF THE INVENTION

It is an object of the present invention to provide improvements for connecting a cable to a P.C. board or similar carrier for electrical circuit elements under utilization of soldering.

In accordance with the preferred embodiment of the present invention, a connection between a multiconductor cable and a P.C. board or a similar type circuit element carrier, is provided under utilization of an auxiliary element preferably including a mounting plate for soldering pins which pins are electrically connected to the conductors of the cable in the interior of the element; the pins extend from an exposed side of the element or the mounting plate. These pins are inserted in solder sleeves in the P.C. board or carrier and are soldered thereto. The auxiliary element is, of course, made of electrically insulating material. It can now be seen that the particular connection is prepared by means of solder pins which are particularly positioned and electrically connected, for example, soldered to the ends of the wires or conductors of the cable before the connection to the P.C. board or other carrier is made. This permits an independent testing, that in fact the connections between solder pins on one hand and the conductors on the other hand, are properly made. Once these connections have been established as having been properly made, the pins are plugged into the P.C. board or carrier and particularly into prepared positions of solder sleeves in that board or carrier whereby preferably a particular position code may be employed so that the position of pins in the sleeves is unambiguously predetermined.

The auxiliary element, and particularly the solder pin mounting plate referred to earlier is preferably provided with a fastening structure, such as a bolt or screw by means of which this element can be connected and fastened to the P.C. board or other carrier. This feature is additionally instrumental in insuring the proper relative positioning between the solder pins and cable conductors, on the other hand, and the solder sleeves and the electrical connections, on the other hand, as leading to the sleeves on the P.C. board or carrier.

The above mentioned mounting plate may be provided with a two dimentional array of bores, the array being a regular one or not. In either case, all bores are not necessarily occupied by pins so that a unique pin pattern can be established to thereby define an unambiguous orientation of the plate with pins in relation to a matching sleeve pattern on the carrier. This particular approach may not necessarily be practical in the case the number of pins are very large. In this case, it may be advisable to provide the auxiliary member, and here particularly the mounting plate with indexing means for properly orienting the plate to the P.C. board to which it is connected. One of the indexing elements may be the screw, by means of which the element is fastened to the P.C. board or any other carrier. An additional indexing projection or the like, may be provided on that carrier to be inserted in a suitable opening of the P.C. board to thereby fix the orientation of the element as a whole, and particularly in relation to the axis of the screw so that the pin carrying plate is now oriented as a whole in an unambiguous fashion.

Generally speaking, tension relief should be provided for any solder connection within the connection system as described. This is obtained by using the above mentioned mounting plate and by molding the remainder of the auxiliary element to that plate, thereby embedding the connection between solder pins and conductors. If in addition, as stated, the particular mounting plate is bolted to the P.C. board, then any mechanical load acting between the cable and the P.C. board by-passes the conductors and solder pins.

DESCRIPTION OF THE DRAWINGS

While the specification concludes with claims particulary pointing out and distinctly claiming the subject matter which is regarded as the invention, it is believed that the invention, the objects and features of the invention and further objects, features and advantages thereof, will be better understood from the following description taken in connection with the accompanying drawings in which:

DETAILED DESCRIPTION OF THE DRAWINGS

Figure 1:
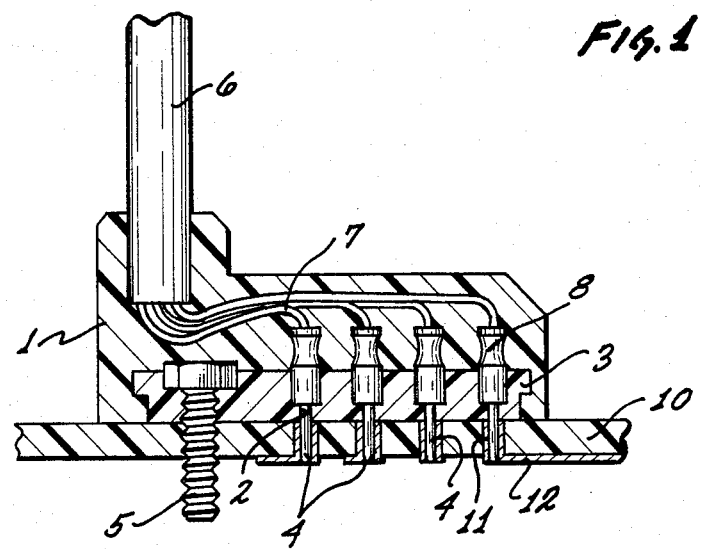
FIG. 1 is a cross sectional view through an auxiliary member constructed in accordance with the preferred embodiment of the invention and showing in association with a printed circuit board for practicing the best mode of the invention.
Figure 2:
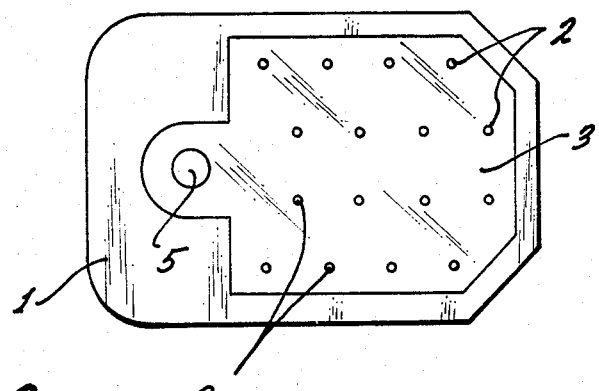
FIG. 2 is a bottom view of the element shown in FIG. 1.

FIGS. 1 and 2 illustrate a particular carrier or auxiliary member 1, constructed by injection molding or otherwise shaping electrically insulated material and having a shallow opening near a bottom portion. A plate 3 is inserted into that opening, the plate being likewise made of electrically insulating material and serving, in the essence, as a member that predetermines the positions of pins 4 to each other. The plate 3 has openings which are wider on the inside facing the member 1 than on the outside surface which constitutes the bottom surface of this particular auxiliary member. Plate 3 carries a head screw or threaded pin 5 which projects relatively far from the plate 3.

The plate 3 is provided with a plurality of bores 2, a plurality of solder pins 4 are respectively inserted in the narrow or small size portions of the openings 2 in the plate 3. These pins 4 project from the common bottom of the assembly 1-3, but not as far as the fastening element 5 projects. The pins 4 as so positioned are arranged in a particular code or pattern, such that they can be plugged into a matching pattern of circuit elements in a particular orientation and in an unambiguous manner. The bores 2 may directly define that pattern. However, for purposes of universality, the particular mounting plates 3 can be provided with a relatively large number of bores arranged not necessarily in an asymmetric pattern, but in a regular pattern or array. Not all bores, however, are provided with solder pins and the position encoding can be obtained by quasi irregular placement of pins into selected positions of the bores 2. Moreover, one can see that these plates 3 can be provided with bores for a more than the maximum number of pins, and any lesser number of pins can be used in any particular case adapting this auxiliary element to any kind of unique configuration. The unique pin pattern on plate 3 is provided for establishing an unambiguous orientation of the pins and of plate 3 as a whole to a pattern of socket like solder sleeves 11 in a P.C. board 10. These sleeves 11 are arranged, for instance, near a corner or any other suitable location on the board. Circuit etchings or other laminate conductors 12 lead to and from these socket solder sleeves 11.

It should be mentioned that in the alternative, the proper orientation of member 3 in relation to the P.C. board 10, can be provided under utilization of the fastening screw 5, which defines to some extent the position of the element 1 on the board 10, and in addition, an indexing nose may be provided, for example, projecting from the plate 3 to be inserted in an appropriate opening in board 10 to thereby in effect define the exact angle of the plate 3 vis'-a'-vis the positioning axis as defined by the screw 5.

The body or element 1 is constructed and configured for embedding the end of a multiconductor cable 6. The individual conductors 7 project from the insulation jacket which envelopes the cable as a whole and these individual conductors 7 are fastened to connecting elements 8 for respectively connecting the individual conductors to the solder pins 4. The connection between conductors 7 and elements 8 is both a physical one as well as an electrical one.

It can readily be seen that this device is made in a manner which insures proper connection and association of contact making elements with the individual wires of the cable. The plate 3 is prepared as an individual piece and provided either with the bore pattern that is necessary for proper locating and positioning of the soldering pins, or the pins are uniquely arranged in an array of bores. The soldering pins 4 as inserted assume the requisite position. Next the individual wires 7 are connected to the connecting elements 8 of the soldering pins, whereupon the circuit as such can readily be tested to make sure that all connections have been properly made. Each of these pins is assigned a particular position for the connection to be made later in a printed circuit board, so that upon making the proper connections between wires 7 and pins 4 it is assured that the final connections will indeed be correct. Having completed this connection, the body 1 is cast, or otherwise molded around the conductor portions to the extent they are exposed; the end of the still jacketed cable 6; and around the plate 3 leaving exposed only one side, the one which the pin 4 project.

The auxiliary body 1, 3 now firmly holding the solder pins 4, is positioned onto the P.C. board 10 and the pins 4 are inserted into soldering sleeves 11 of that printed circuit board 10 or any other kind of suitable carrier for electrical circuit elements. The fastening member 5 is likewise inserted in an appropriate opening in the circuit board 10 and this way the auxiliary element 1 is fastened to the P.C. board.

The pins as inserted into the appropriate solder sleeves of the sleeve pattern of the board may now be soldered to these sleeves. It can readily be seen that not only are the proper connections assured, but any forces tending to act between the cable 6 on one hand, and the circuit board 10, on the other hand, will not affect the solder connection between pins and solder sleeves nor will the electrical connections between the wire 7 and the solder pins 4 be affected because the plate 3 is bolted to the P.C. board 10 and the plate 3 is physically combined with the cable 6 by means of the cast around element 1. This way forces are transmitted via the pin 5, the plate 3, and the body 1 without affecting the embedded inserted and soldered electrical circuit elements.

FIG. 1 shows, in addition, that the P.C. board is provided with printed circuit etchings or conductive platings 12; they are shown on one side only but, of course, both sides are available for that purpose if that is so desired. Since the P.C. board is provided with a pattern of these sleeves which are corresponding the position coded, incorrect insertion of the solder pins 4 is not possible. One can also see that the particular board or other circuit element carrier, is provided for making this connection in a manner which is not limited to an edge of the board, but in a particular designated area provided for that purpose.

The figure shows an auxiliary element as being connected to one cable 6, it is, of course, possible to connect more than one cable to pins in a plate 3 and combine these elements, including the several cable physically, by molding a common body 1 around the ends as described and illustrated.

The invention is not limited to the embodiments described above, but all changes and modifications thereof not constituting departures from the spirit and scope of the invention are intended to be included.

I claim:

1. A method of connecting a multiconductor cable to conductors on a circuit carrier such as a printed circuit board comprising the steps of:

providing a mounting plate having a plurality of bores arranged in a pattern;

arranging solder pins in some of these bores and in a particular pattern involving a smaller number of pins than there are bores in the plate, the solder pins projecting from one side of the mounting plate;

fastening conductors of the cable to the pins on the respective other side of the plate;

molding a carrier element partially around said carrier plate thereby sealingly embedding the connection between the conductors of the cable and the soldering pins, but leaving the pins as projecting from the carrier plate exposed;

inserting the soldering pins in a pattern, of soldering sleeves in said circuit element carrier the pattern of sleeves matching the particular pattern of said pins;

soldering the pins and the sleeves to each other, thereby completing the electrical connections between the conductors of the cables, and conductors on the circuit element carrier as connected on the board or carrier to the soldering sleeves.

2. The method as in claim 1, and including the step of additionally fastening the carrier element to the printed circuit board or circuit element carrier for obtaining relief from any forces that may act upon the cable or the printed circuit board or carrier.

3. The method as in claim 1, said pins being arranged in an areal-encoded partially asymmetric pattern.

* * * * *